(12) United States Patent
Wong et al.

(10) Patent No.: US 8,878,176 B2
(45) Date of Patent: Nov. 4, 2014

(54) METAL-OXIDE BASED THIN-FILM TRANSISTORS WITH FLUORINATED ACTIVE LAYER

(75) Inventors: Man Wong, Hong Kong (CN); Hoi Sing Kwok, Hong Kong (CN); Zhi Ye, Hong Kong (CN)

(73) Assignee: The Hong Kong University of Science and Technology, Hong Kong (CN)

( * ) Notice: Subject to any disclaimer, the term of this patent is extended or adjusted under 35 U.S.C. 154(b) by 0 days.

(21) Appl. No.: 13/572,269

(22) Filed: Aug. 10, 2012

(65) Prior Publication Data

US 2013/0037798 A1      Feb. 14, 2013

Related U.S. Application Data

(60) Provisional application No. 61/573,031, filed on Aug. 11, 2011.

(51) Int. Cl.
    *H01L 29/10*     (2006.01)
    *H01L 29/12*     (2006.01)
    *H01L 29/786*     (2006.01)

(52) U.S. Cl.
    CPC ................ *H01L 29/7869* (2013.01)
    USPC ............ 257/43; 257/56; 257/58; 257/62; 257/65; 257/E29.296

(58) Field of Classification Search
    CPC .......... H01L 29/7869; H01L 29/78693
    USPC .......... 257/43, 65, E29.296, 56, 58, 62
See application file for complete search history.

(56) References Cited

U.S. PATENT DOCUMENTS

| | | | |
|---|---|---|---|
| 4,945,065 A | 7/1990 | Gregory et al. | |
| 5,124,180 A | 6/1992 | Proscia | |
| 5,212,108 A | 5/1993 | Liu et al. | |
| 5,523,240 A | 6/1996 | Zhang et al. | |
| 5,665,611 A | 9/1997 | Sandhu et al. | |
| 6,534,354 B1 | 3/2003 | Lee et al. | |
| 7,470,607 B2 | 12/2008 | Carcia et al. | |
| 7,638,360 B2 | 12/2009 | Ryu et al. | |
| 7,682,882 B2 | 3/2010 | Ryu et al. | |
| 7,982,216 B2 * | 7/2011 | Imai | 257/43 |
| 8,268,666 B2 * | 9/2012 | Abe et al. | 438/104 |

(Continued)

FOREIGN PATENT DOCUMENTS

WO    WO 2010021349 A1 *   2/2010

OTHER PUBLICATIONS

Wong et al., U.S. Appl. No. 61/573,031, filed Aug. 11, 2011.

(Continued)

*Primary Examiner* — Matthew W Such
*Assistant Examiner* — Samuel Lair
(74) *Attorney, Agent, or Firm* — Leydig, Voit & Mayer, Ltd.

(57) ABSTRACT

A thin-film transistor with a fluorinated channel and fluorinated source and drain regions and methods of fabrication are provided. The thin-film transistor includes: a substrate; a semiconductor active layer of fluorine-doped metal-oxide formed on the substrate; fluorine-doped source and drain regions disposed adjacent to the semiconductor active layer; a gate electrode disposed over the semiconductor active layer, configured to induce a continuous conduction channel between the source and drain regions; and a gate dielectric material separating the gate electrode and the channel.

10 Claims, 20 Drawing Sheets

(56) References Cited

U.S. PATENT DOCUMENTS

| | | | |
|---|---|---|---|
| 8,497,502 B2* | 7/2013 | Yaegashi | 257/43 |
| 8,525,165 B2* | 9/2013 | Akimoto | 257/43 |
| 2006/0244107 A1 | 11/2006 | Sugihara et al. | |
| 2006/0261447 A1* | 11/2006 | Seto et al. | 257/644 |
| 2007/0278490 A1* | 12/2007 | Hirao et al. | 257/64 |
| 2009/0272999 A1* | 11/2009 | Yoshida et al. | 257/98 |
| 2009/0283762 A1* | 11/2009 | Kimura | 257/43 |
| 2011/0175082 A1* | 7/2011 | Kim et al. | 257/43 |

OTHER PUBLICATIONS

Chang et al., "Improved Electrical Characteristics and Reliability of MILC Poly-Si TFTs Using Fluorine-Ion Implantation," *IEEE Electron Device Letters*, vol. 28, No. 11, Nov. 2007.

Kim et al., "Effect of fluorine addition on transparent and conducting Al doped ZnO films," *Journal of Applied Physics*, 100, 063701 (2006).

Xu et al., "F-doping effects on electrical and optical properties of ZnO nanocrystalline films," *Applied Physics Letters*, 86, 123107 (2005).

Shinde et al., "Physical properties of transparent and conducting sprayed fluorine doped zinc oxide thin films," *Solid State Science*, 10, pp. 1209-1214 (2008).

Kim et al., "Characteristics of ZnO: Al thin films co-doped with hydrogen and fluorine," *Applied Surface Science*, 256, pp. 5102-5107 (2010).

Liu et al., "First-principles study of fluorine-doped zinc oxide," *Applied Physics Letters*, 97, 122101 (2010).

Ozgur, U, et al., "*A comprehensive review of ZnO materials and devices,*" *J. Appl. Phys.*, 98,(2005) (104 pages).

Arai, Toshiaki, et al., "49.01: Invited Paper: Emergent Oxide TFT Technologies for Next Generation AM-OLED Displays" *Sony Corporation data, SID Tech. Dig.*, 2011, pp. 710-713, ISSN 0097-966X/11/4202-0710. (3 pages).

Ye, Zhi, et al., "*Characteristics of Thin-Film Transistors Fabricated on Fluorinated Zinc Oxide,*" *IEEE Electron Device Lett.*, vol. 33, No. 4, pp. 549-551, Apr. 2012, (3 pages).

Ye, Zhi, et al., "*Characteristics of Plasma-Fluorinated Zinc Oxide Thin-Film Transistors,*" *IEEE Electron Device Lett.*, vol. 33, No. 8, pp. 1147-49, Aug. 2012 (3 pages).

* cited by examiner

# METAL-OXIDE BASED THIN-FILM TRANSISTORS WITH FLUORINATED ACTIVE LAYER

CROSS-REFERENCE TO RELATED APPLICATIONS

This patent application claims the benefit of U.S. Provisional Patent Application No. 61/573,031, filed Aug. 11, 2011, which is incorporated by reference.

BACKGROUND

Metal-oxide based thin-film transistors (TFTs) have received much attention as replacements for silicon-based TFTs in display applications. The advantages of using metal-oxide based TFTs over their silicon-based counterparts are many: including transparency, high on/off current ratio, high carrier mobility, low off leakage current, and relatively low processing temperature.

However, a high density of defects—including native defects (oxygen vacancies, zinc interstitials), dangling bonds, and grain boundaries—are present in commonly-used metal-oxide semiconductors, and TFTs built on such defective material exhibit poor sub-threshold slope, instability and performance non-uniformity. Thus, there exists a need to reduce the density of defects for metal-oxide based TFTs.

SUMMARY

With the introduction of a suitable amount of fluorine into such metal-oxides, the density of the defects can be significantly reduced. The performance of metal-oxide based TFTs built on such passivated metal-oxide is greatly improved, including reduced source/drain resistance for a given impurity concentration, better device uniformity and reliability, lower sub-threshold slope and higher field-effect mobility.

In an embodiment, the present invention provides a thin-film transistor. The thin-film transistor includes: a substrate; a semiconductor active layer of fluorine-doped metal-oxide formed on the substrate; fluorine-doped source and drain regions disposed adjacent to the semiconductor active layer; a gate electrode disposed over the semiconductor active layer, configured to induce a continuous conduction channel between the source and drain regions; and a gate dielectric material separating the gate electrode and the channel.

In a further embodiment the present invention provides a method of producing a thin-film transistor. The method includes: forming a metal-oxide semiconductor active island on a substrate; forming a gate dielectric layer on top of the active island and the substrate; introducing fluorine into the semiconductor active island through the gate dielectric layer; forming a gate electrode of the transistor; introducing impurities including fluorine into source and drain regions and activating the impurities; forming a second insulating layer; opening access holes through the gate dielectric layer and the second insulating layer to expose a gate and the source and drain regions of the transistor; forming a metal layer on top of the second insulating layer; and patterning the metal layer to form interconnects.

In yet another further embodiment, the present invention provides another method of producing a thin-film transistor. The method includes: forming a semiconductor active island on a substrate; introducing fluorine into the semiconductor active island; forming a gate dielectric material on top of active island and the substrate; forming a gate electrode of the transistor; introducing impurities including fluorine into the source and drain regions of the transistor and activating the impurities; forming a second insulating layer; opening access holes through the gate dielectric material and the second insulating layer to expose a gate and the source and drain regions of the transistor; forming a metal layer on top of the second insulating layer; and patterning the metal layer to form interconnects.

DETAILED DESCRIPTION

Metal-oxide based TFTs are formed in a semiconducting metal-oxide layer placed on a substrate. TFTs generally includes a gate-modulated channel region located between source and drain regions. According to embodiments of the present invention, the metal-oxide semiconducting active layer is passivated with different concentration of fluorine distributed in regions of the channel and the source/drain.

Respective optimum volume concentrations of fluorine in the channel and source/drain were determined to be $10^{19}$-$4 \times 10^{20}$/cm$^3$ and $\geq 5 \times 10^{20}$/cm$^3$. A series of experiments was performed to arrive at these optimal concentrations, which are described in detail in Z. Ye and M. Wong, "Characteristics of thin-film transistors fabricated on fluorinated zinc oxide," IEEE Electron Device Lett., vol. 33, no. 4, pp. 549-551, Apr. 2012, which is incorporated by reference in its entirety.

The fluorine can be introduced into the active layer directly or through a cover-layer using conventional micro-fabrication techniques. It will be appreciated that the embodiments described herein contemplate source and drain regions having the same concentration of fluorine, but other embodiments may include source and drain regions having disparate concentrations of fluorine (so long as both are $\geq 5 \times 10^{20}$/cm$^3$).

Relative to the performance of TFTs constructed on conventional metal-oxides without fluorine passivation, metal-oxide based TFTs that were fluorinated according to embodiments of the present invention exhibited higher field-effect mobility, lower sub-threshold slope, and lower source/drain parasitic resistance.

Figure 1A:
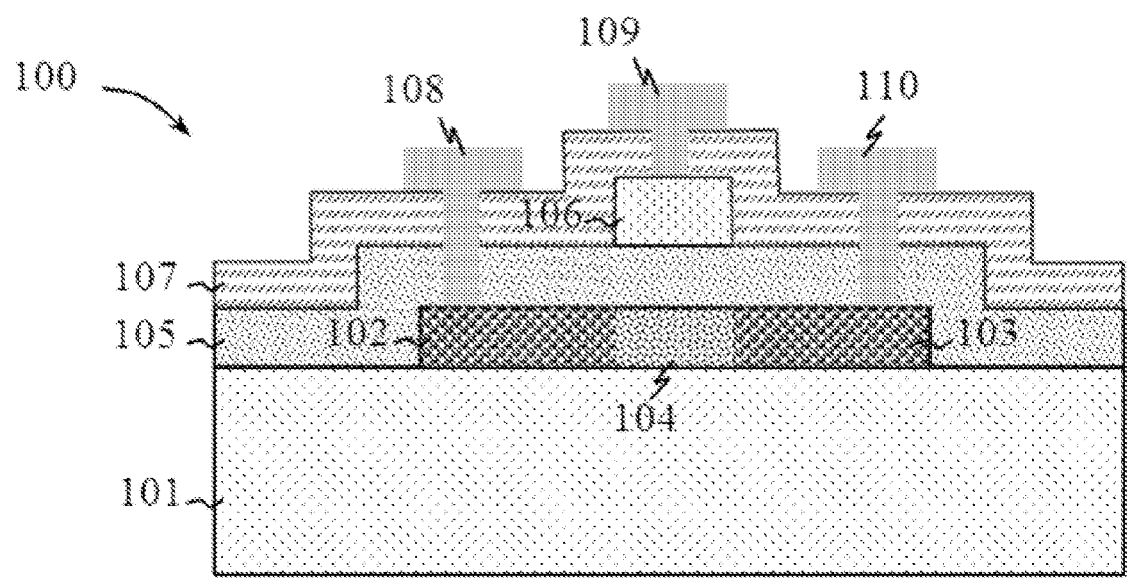
FIG. 1A depicts a schematic cross-section of an embodiment of a top-gated self-aligned TFT including a fluorinated channel, source and drain.
Figure 1B:
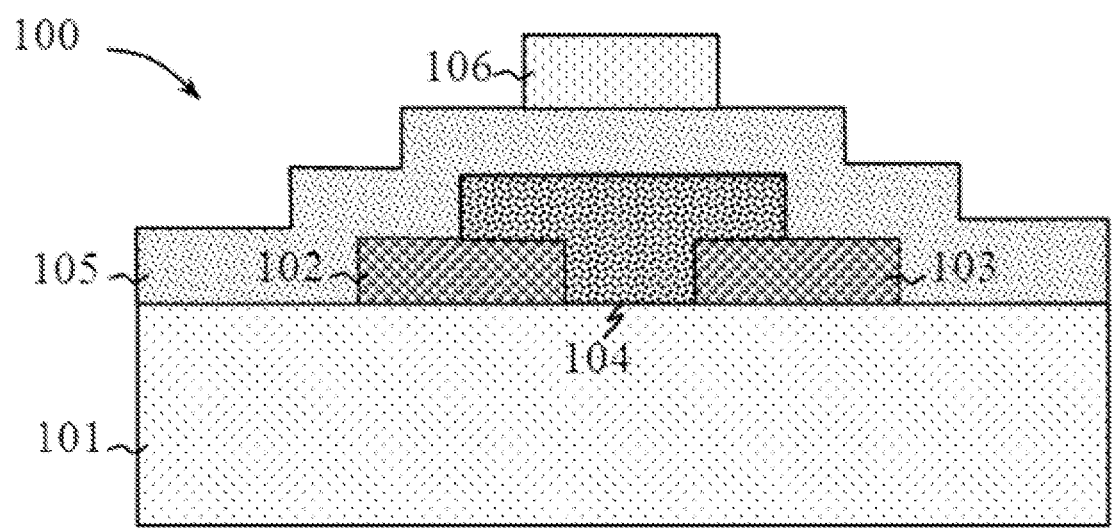
FIG. 1B depicts a schematic cross-section of an embodiment of a top-gated staggered TFT containing fluorinated channel and source/drain.
Figure 1C:
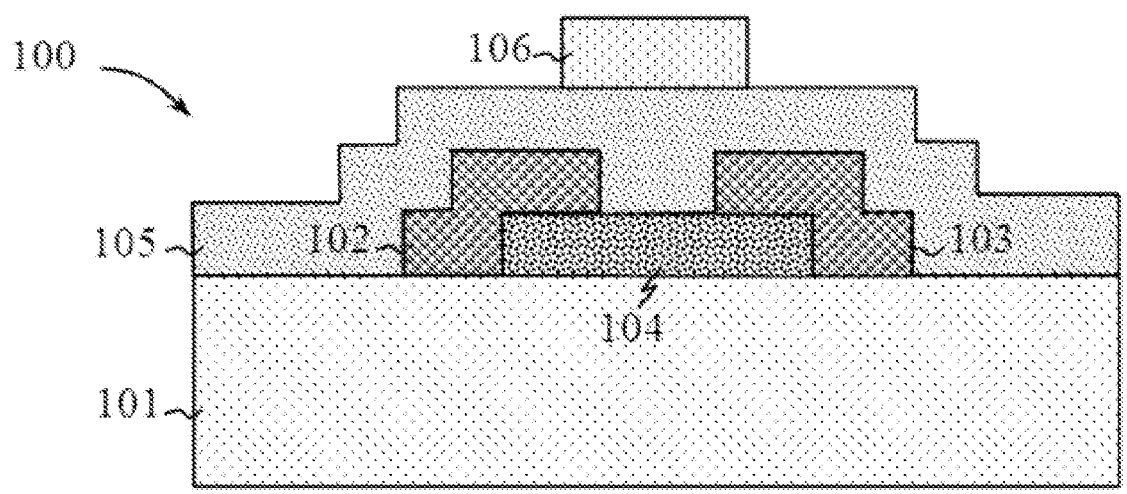
FIG. 1C depicts a schematic cross-section of an embodiment of a top-gated coplanar TFT containing fluorinated channel and source/drain.
Figure 1D:
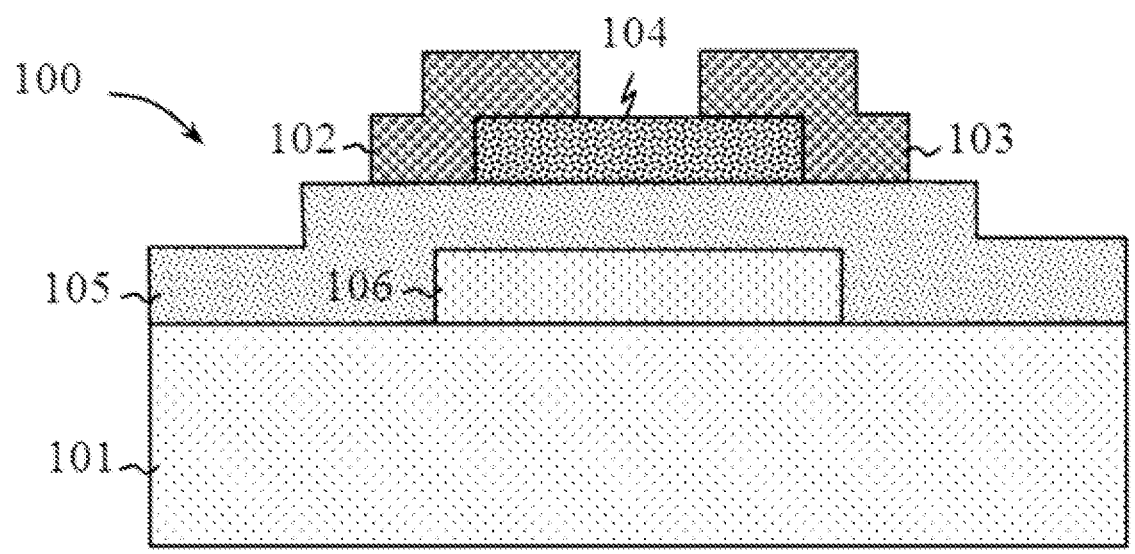
FIG. 1D depicts a schematic cross-section of an embodiment of a bottom-gated staggered TFT containing fluorinated channel and source/drain.
Figure 1E:
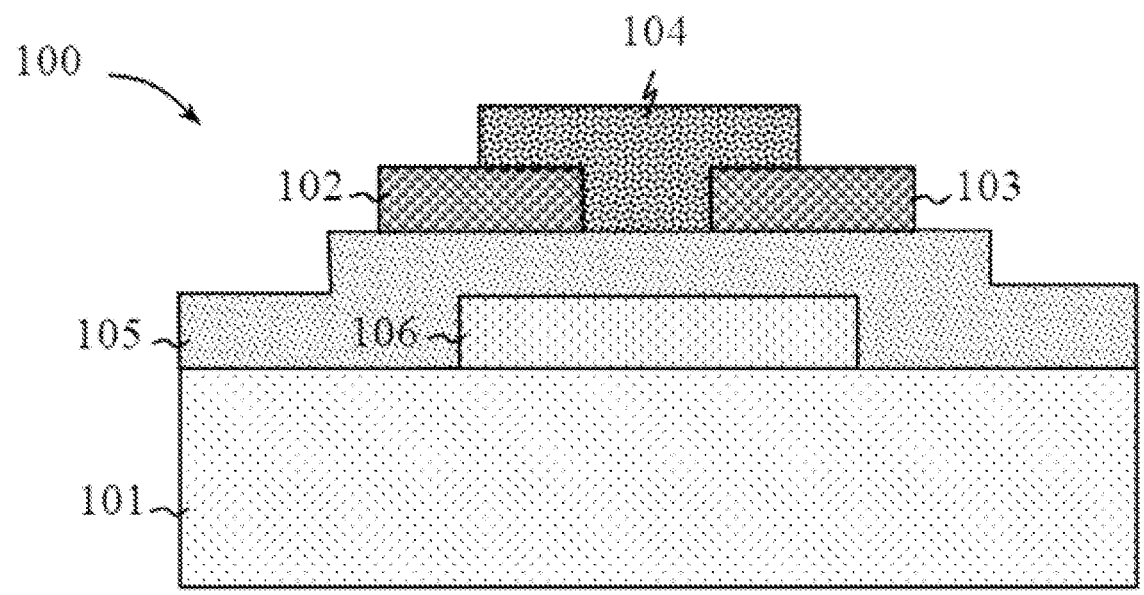
FIG. 1E depicts a schematic cross-section of an embodiment of a bottom-gated coplanar TFT containing fluorinated channel and source/drain.
Figure 1F:
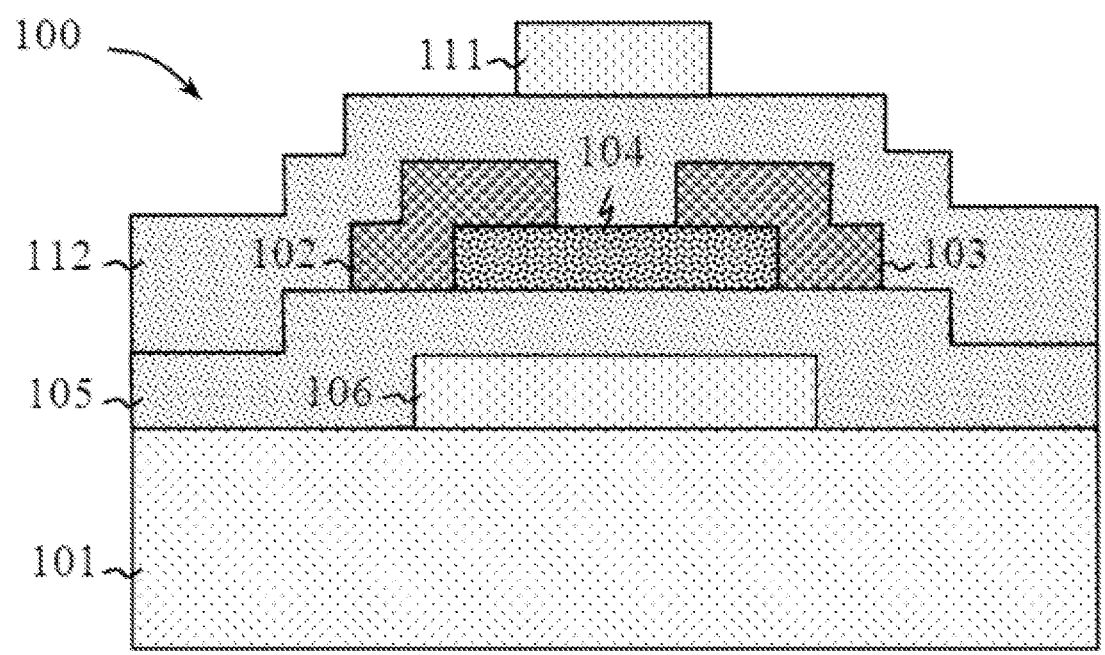
FIG. 1F depicts a schematic cross-section of an embodiment of a double-gate TFT containing fluorinated channel and source/drain.
Figure 1G:
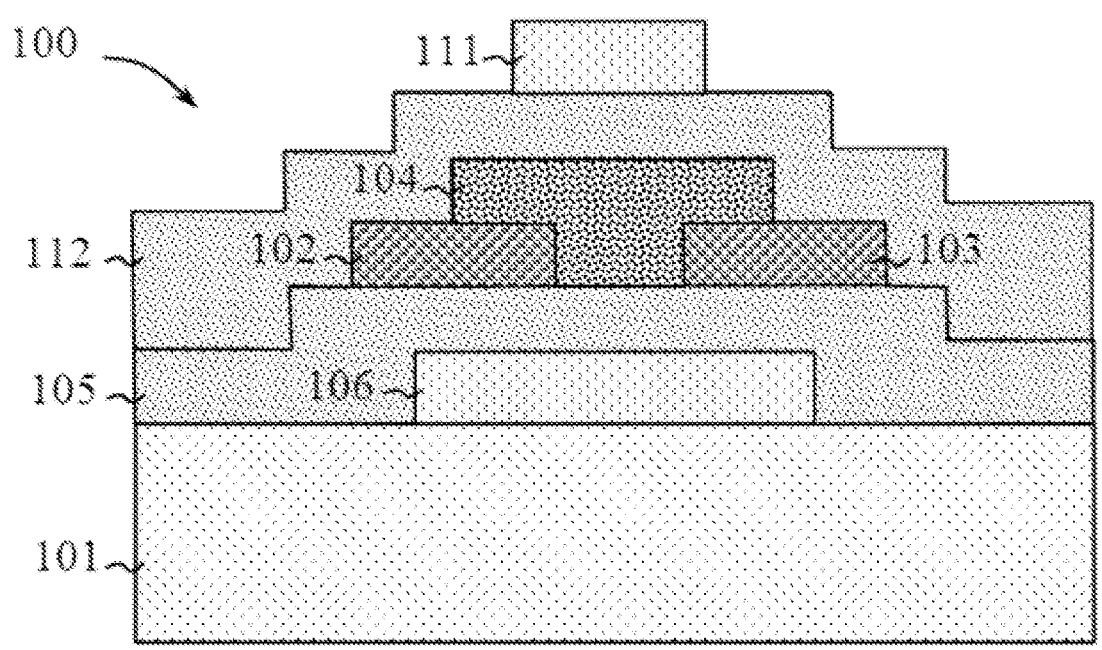
FIG. 1G depicts a schematic cross-section of an embodiment of a double-gate TFT containing a fluorinated channel and source/drain.

FIGS. 1A to 1G depict various embodiments of a metal-oxide based TFT (100) passivated with different concentrations of fluorine distributed in the channel, source and drain regions. The TFT can be of any type, including but not limited to: TFTs with horizontal electrodes, vertical electrodes, coplanar electrodes (a TFT structure where the source and drain electrodes are positioned on the same side of the channel as the gate electrode), and staggered electrodes (a TFT structure where the source and drain electrodes are positioned on the opposite side of the channel as the gate electrode); and top-gated, bottom-gated, single-gated and multiple-gated TFTs. FIGS. 1A, 1B and 1C depict top-gated TFTs. FIGS. 1D and 1E depict bottom-gated TFTs. FIGS. 1F and 1G depict double-gated TFT.

In FIG. 1A, the source (102) and drain (103) regions are defined in parts of the same active layer as the channel (104) region. The regions (102), (103) and (104) are made of the fluorinated metal-oxide semiconductor material. However, the fluorine concentration in the source (102) and drain (103) regions is higher than that of the channel (104) region.

In each of the FIGS. 1A to 1E, the TFTs include additionally a substrate (101), a gate electrode (106) and a gate dielectric (105). In each of the FIGS. 1F and 1G, the TFTs include a substrate (101), two gate electrodes (106) and (111), two gate dielectrics (105) and (112), a channel (104), a source (102), and a drain (103).

The substrate (101) can be one of the following materials, including but not limited to: polymer, glass, stainless steel, amorphous silicon, polycrystalline silicon, or single-crystalline silicon optionally containing pre-fabricated conventional integrated circuits. The substrate can also, but not necessarily, includes an electrically insulating cover layer.

The gate electrode (106) and (111) can be any metal or metallic alloy in amorphous or polycrystalline form, or a transparent-conducting oxide such as indium-tin oxide or doped zinc oxide, etc. The gate dielectric material (105) and (112) can be one of the following materials, including but not limited to: silicon dioxide, silicon oxynitride, silicon nitride, or high dielectric constant (high-κ) insulating materials.

The channel (104) is a metal-oxide semiconductor. For example, it can be any one of an oxide of zinc, tin, copper or indium. It can also be an oxide of an alloy consisting of two or more elements from the list of zinc, tin, indium, gallium, aluminum, titanium, silver, and copper; such as indium-gallium-zinc oxide.

The channel (104) is doped with fluorine ions using any of a variety of techniques, such as ion implantation, diffusion from a fluorine-containing plasma, metal-organic chemical vapor deposition, atomic layer deposition, photo-atomic layer deposition, plasma enhanced chemical vapor deposition, radio-frequency magnetron sputtering, evaporation, sol-gel, or any other conventional doping techniques.

In each of the FIGS. 1B to 1G, the source (102) and drain (103) regions/electrodes are any metal-oxide semiconductor doped with fluorine, such as transparent-conducting oxide. Examples of transparent-conducting oxides include indium-tin oxide and doped zinc oxide.

FIGS. 2A to 2E depict cross-sectional views during an exemplary fabrication process (200) for a TFT having different concentrations of fluorine distributed in regions of the channel, source, and drain.

Figure 2A:
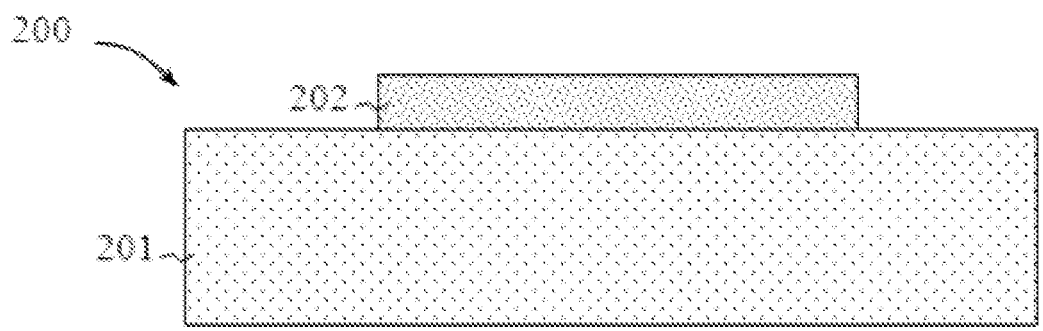
FIG. 2A depicts a schematic cross-section of a patterned active island on a substrate.
Figure 2B:
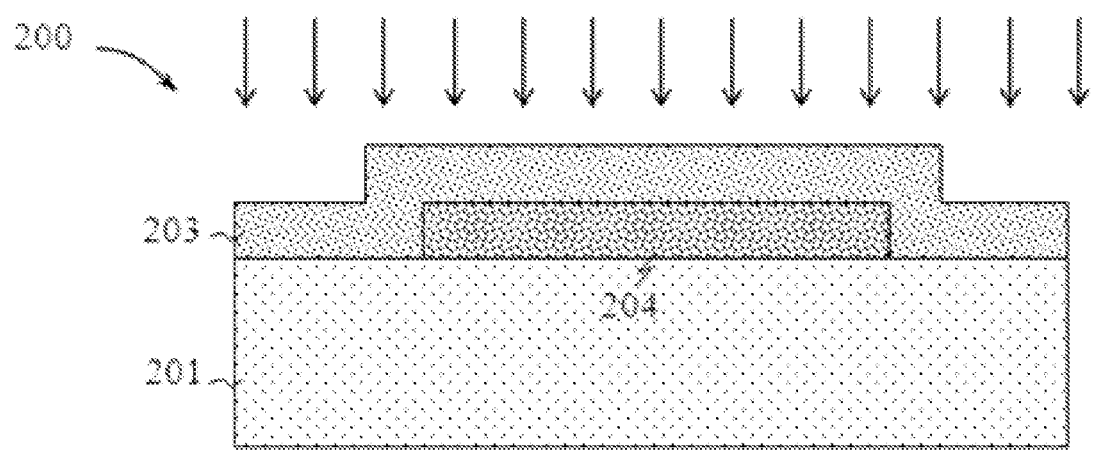
FIG. 2B depicts a schematic cross-section of a patterned active island covered by a gate dielectric material layer and exposed to fluorine-containing scanning ion beams or shower.

FIG. 2A depicts a semiconductor active island (202) of a TFT formed on a substrate (201). FIG. 2B depicts the formation of a gate dielectric layer (203). A fluorinated active island (204) is formed by implanting fluorine-containing ion beams through the gate dielectric layer (203).

Figure 2C:
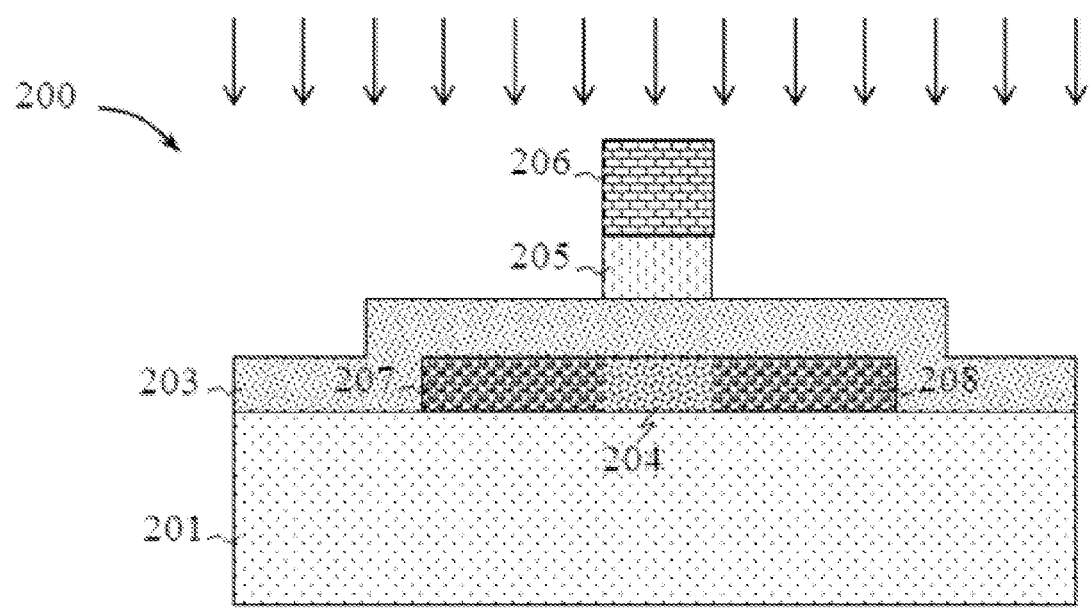
FIG. 2C depicts a schematic cross-section after formation and patterning of a gate electrode and exposure to fluorine-containing ion beams to form higher fluorine concentrations in the source and drain.

FIG. 2C depicts the formation of a gate electrode (205) and patterning of the TFT using photoresist mask (206). Also shown in the cross-section of FIG. 2C is the self-aligned introduction of dopant impurities, such as boron, phosphorus, aluminum, arsenic, gallium or indium, into selected regions of the TFT, defining in particular the source (207) and drain (208) regions of the TFT. More fluorine ions are introduced into the source (207) and drain (208) regions, such that the fluorine concentration in the source (207) and drain (208) regions is different from that in the channel (204) region. After a 250-550° C. heat-treatment process, the impurities in the source (207), drain (208) and channel (204) regions are activated.

Figure 2D:
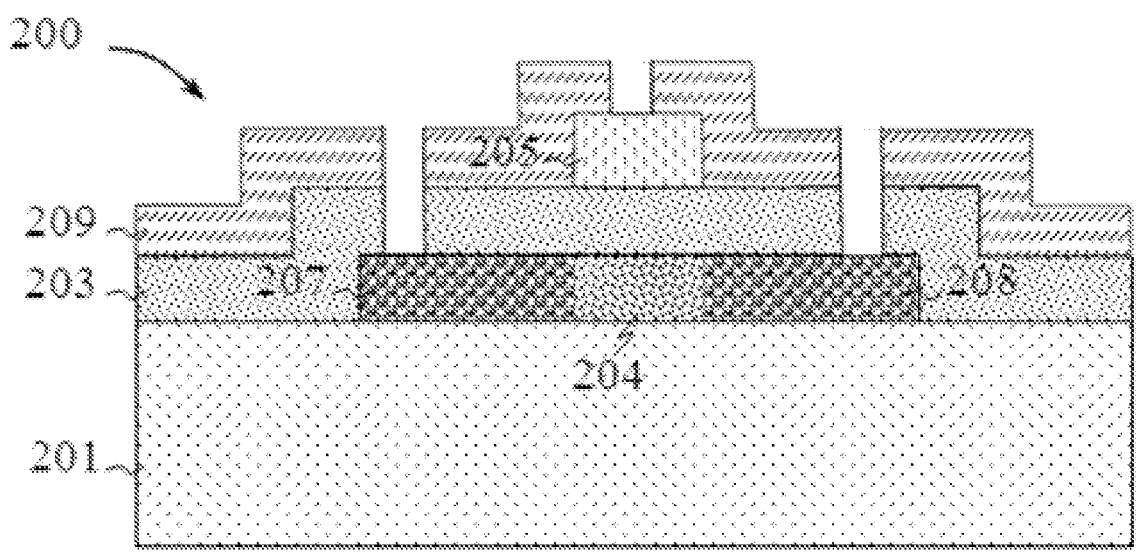
FIG. 2D depicts a schematic cross-section after opening of contact windows through a second insulating layer and the dielectric layer.
Figure 2E:
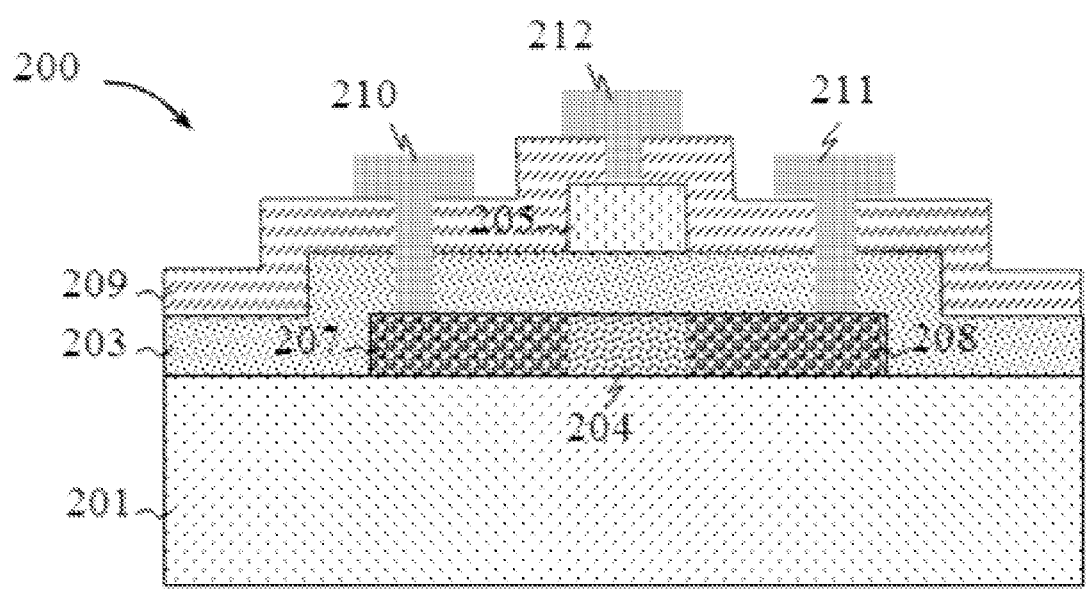
FIG. 2E depicts a schematic cross-section after metal patterning.

FIG. 2D depicts the formation of a second insulating layer (209) and the opening of contact access through layer (209) (e.g., through etching or liftoff technology) such that parts of the gate, source and drain electrode regions are exposed. FIG. 2E depicts a metal layer patterned to form respective electrical interconnects (210), (211) and (212) to the source, drain and gate electrodes of the TFT. The metal layer is formed, for example, through sputtering, electrodeposition, or evaporation.

The active island (202) (or "active layer"), the gate dielectric layer (203), the gate electrode (205), and second insulating layer (209) can be formed by any deposition techniques, for example, sputtering, chemical vapor deposition (CVD), evaporation, atomic layer deposition (ALD), pulse laser deposition (PLD), solution, and epitaxial deposition.

The substrate (201), semiconductor active island (202), gate dielectric layer (203), and gate electrode (205) can be of the same composition as discussed above with respect to the substrate (101), regions (102, 103, 104), gate dielectric materials (105, 112), and gate electrodes (106, 111), respectively. The second insulating layer (209) is similar to the gate dielectrics and can be one of the following materials, including but not limited to: silicon dioxide, silicon oxynitride, silicon nitride. alumina, titanium dioxide, polymer, or other insulating materials.

It will be appreciated that the equipment used to perform the process (200) discussed above is equipment that is compatible with the conventional MOLED (molecular organic light emitting diode) industry. For example, the equipment and processes can include a sputtering machine, PECVD (plasma-enhanced chemical vapor deposition), an ion shower machine, a photolithography system, and an RIE (reactive-ion etching) machine.

Figure 3A:
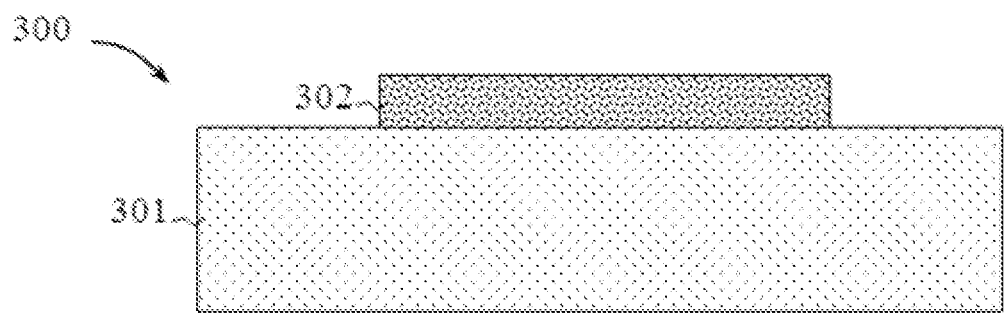
FIG. 3A depicts a schematic cross-section of a patterned active layer containing fluorine on a substrate.
Figure 3B:
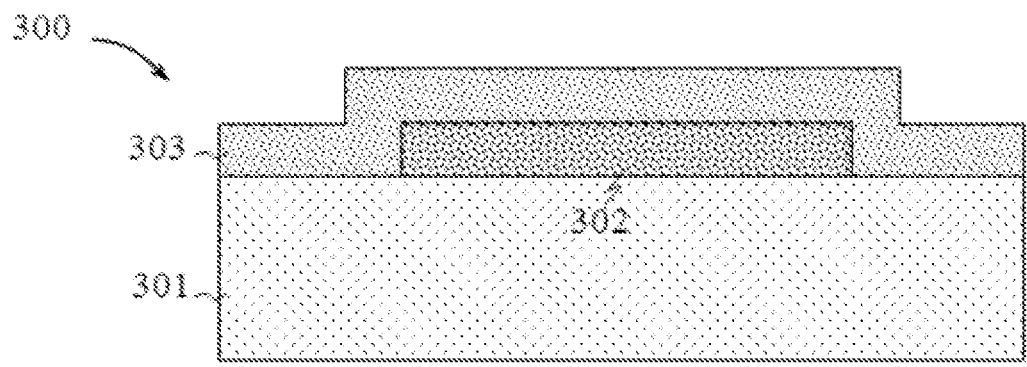
FIG. 3B depicts a schematic cross-section of patterned active islands covered by gate dielectric material layer.

FIGS. 3A-3B depict cross-sectional views during an alternative exemplary fabrication process (300) for a TFT having different concentrations of fluorine distributed in regions of the channel, source, and drain that is similar to that of process 200. According to the process (300) depicted by the cross-sectional views of FIGS. 3A-3B, the semiconductor active island (302) is doped with fluorine using a variety of techniques, such as ion implantation, diffusion from a fluorine-containing plasma, metal-organic chemical vapor deposition, atomic layer deposition, photo-atomic layer deposition, plasma enhanced chemical vapor deposition, radio-frequency magnetron sputtering, evaporation, or any other conventional doping technique. The rest of the fabrication process is similar to that of process (200) discussed above. The difference is that in FIGS. 3A-3B, fluorine is introduced into the active layer during the active layer deposition process without an insulating layer cover, while in FIGS. 2A-2B, the fluorine is introduced into the active layer through an insulating layer.

Figure 4A:
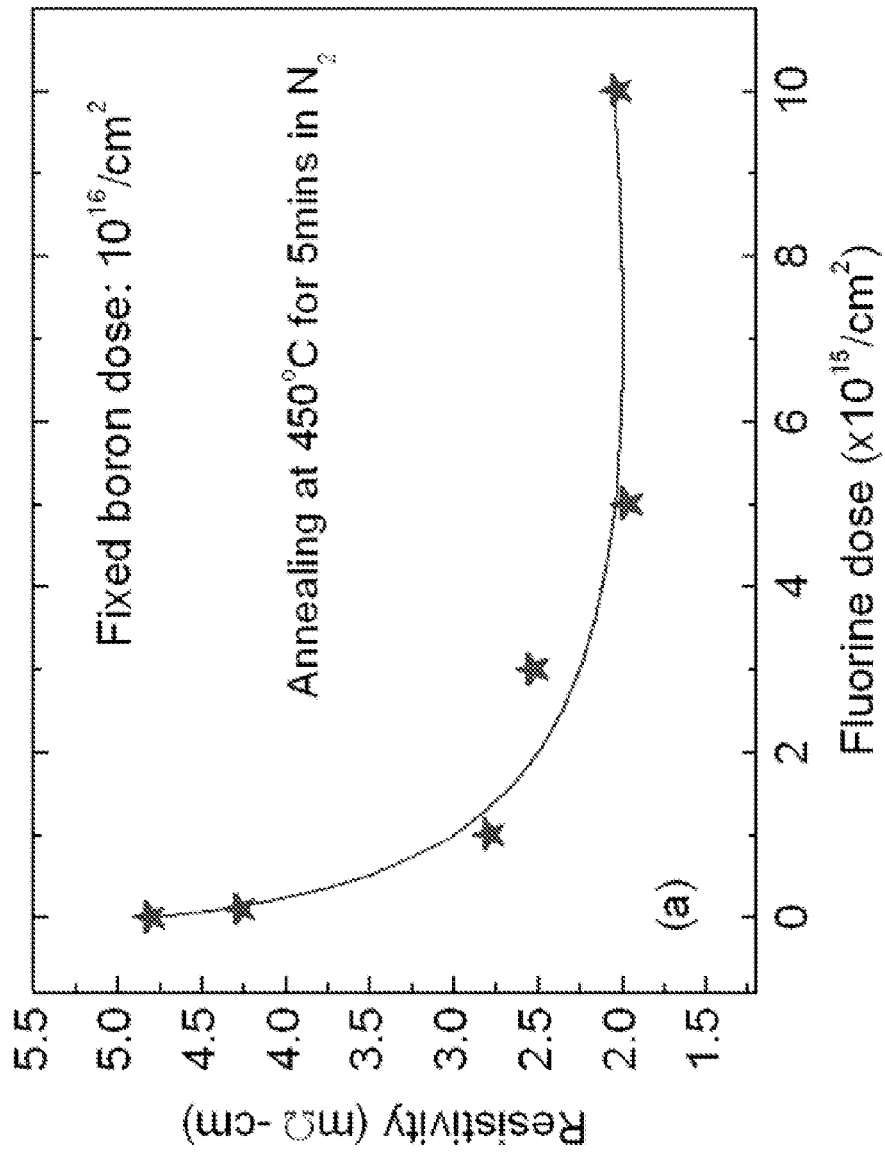
FIG. 4A depicts a graph representing resistivity of the source and drain regions as a function of fluorine dose.
Figure 4B:
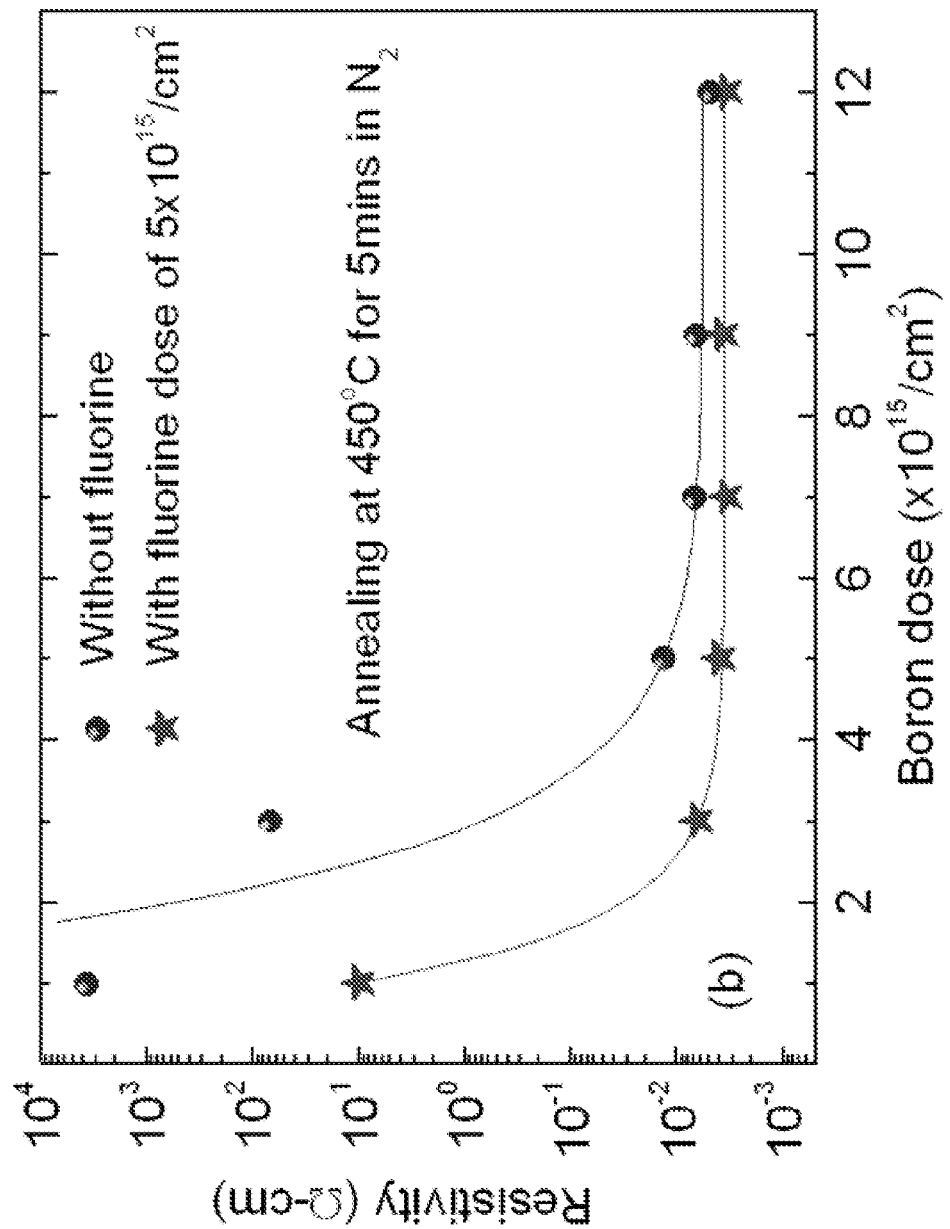
FIG. 4B depicts a graph representing resistivity of the source and drain regions with or without fluorine as a function of boron dose.
Figure 4C:
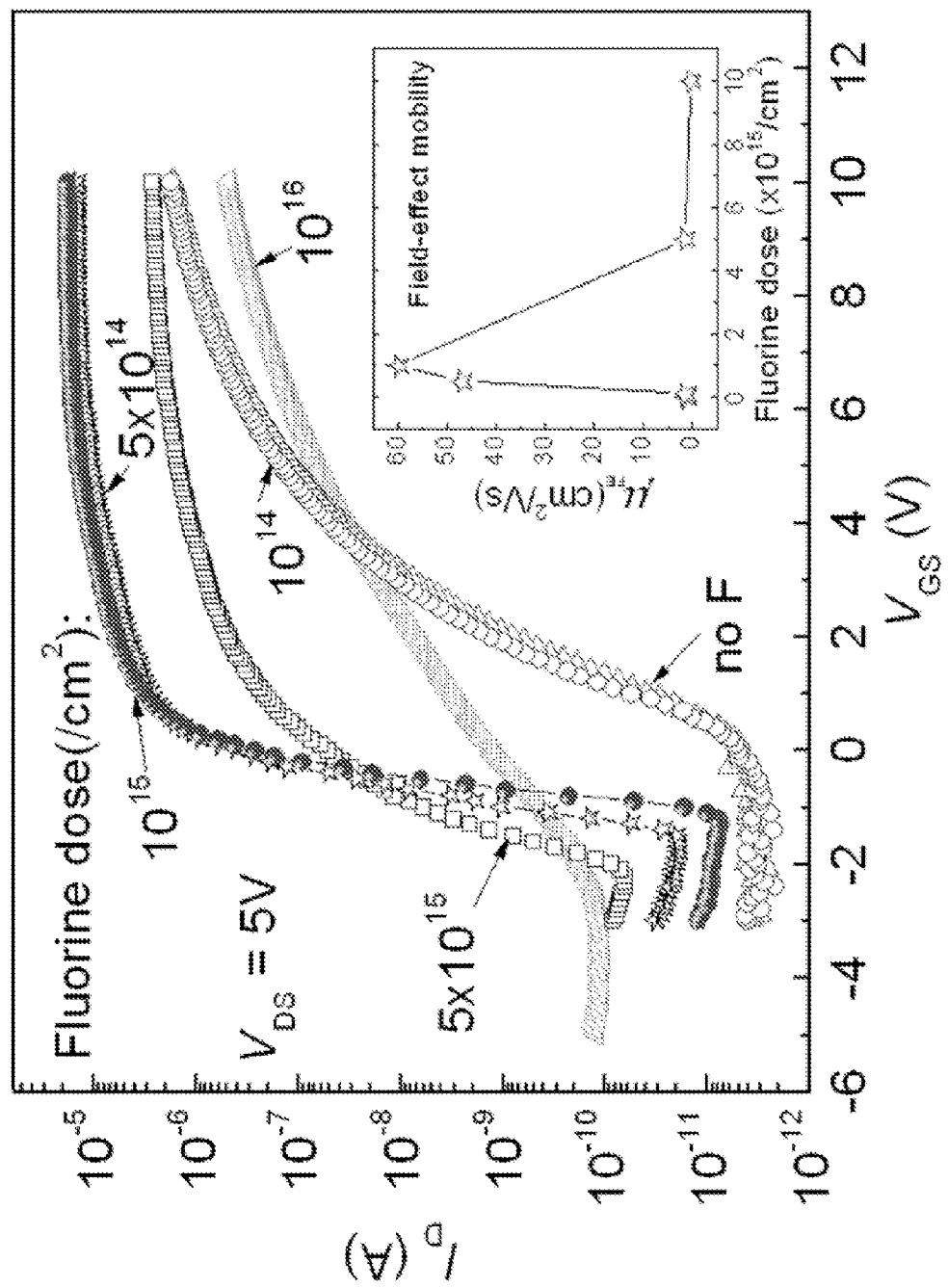
FIG. 4C depicts a graph of drain current ($I_D$) vs. gate voltage ($V_{GS}$) at various doses of fluorine in the channel and a graph of field-effect mobility as a function of fluorine dose in the channel.

In various experimental trials, fluorinated B-doped ZnO conductors were used for the source and drain regions where the fluorine was provided via F ion implantation. As can be seen from FIGS. 4A and 4B corresponding to resistivity of the source and drain regions as a function of Fluorine dose and Boron dose, respectively, a low resistivity of 2 mΩ-cm was achieved by F doses of greater than $5 \times 10^{15}/cm^2$. Further, fluorinated ZnO was used as channel of a ZnO TFTs via F ion implantation. FIG. 4C (a graph of $I_D$ vs. $V_{GS}$ at various doses of F in the channel and a graph of field-effect mobility as a function of F dose in the channel, with F dosages in the source and drain regions of $\geq 5 \times 10^{15}/cm^3$) and Table 1 below shows that TFTs using fluorinated ZnO (via F ion implantation) exhibited higher mobility, lower SS (subthreshold slope), and higher $I_{on}/I_{off}$ ratio.

TABLE 1

Characteristics of ZnO TFTs with different F does in channel.

| | F dose in channel ($/cm^2$) | | | | | |
|---|---|---|---|---|---|---|
| | No F | $5\ 10^{14}$ | $\times 10^{14}$ | $10^{15}$ | $5 \times 10^{15}$ | $10^{16}$ |
| $\mu_{FE}$ ($cm^2/Vs$) | 1.2 | 1.4 | 47 | 60 | 1.5 | 0.25 |
| $V_{th}$ (V) | 3.3 | 3.1 | −0.6 | −0.5 | −1 | −1.6 |
| SS (V/decade) | 0.72 | 0.55 | 0.24 | 0.16 | 0.45 | 2.8 |
| $I_{on}/I_{off}$ | $5 \times 10^5$ | $5 \times 10^5$ | $10^6$ | $5 \times 10^6$ | $4 \times 10^4$ | $8 \times 10^3$ |
| $I_{off}$ (pA) | 5 | 5 | 20 | 7 | 70 | 100 |

In other experimental trials, fluorinated ZnO was used as the channel of ZnO TFTs via F plasma immersion. The source and drain region are the fluorinated B-doped ZnO (via ion implantation). These TFTs with plasma treated channel also exhibited higher mobility, lower SS, and higher $I_{on}/I_{off}$ ratio.

Figure 5:
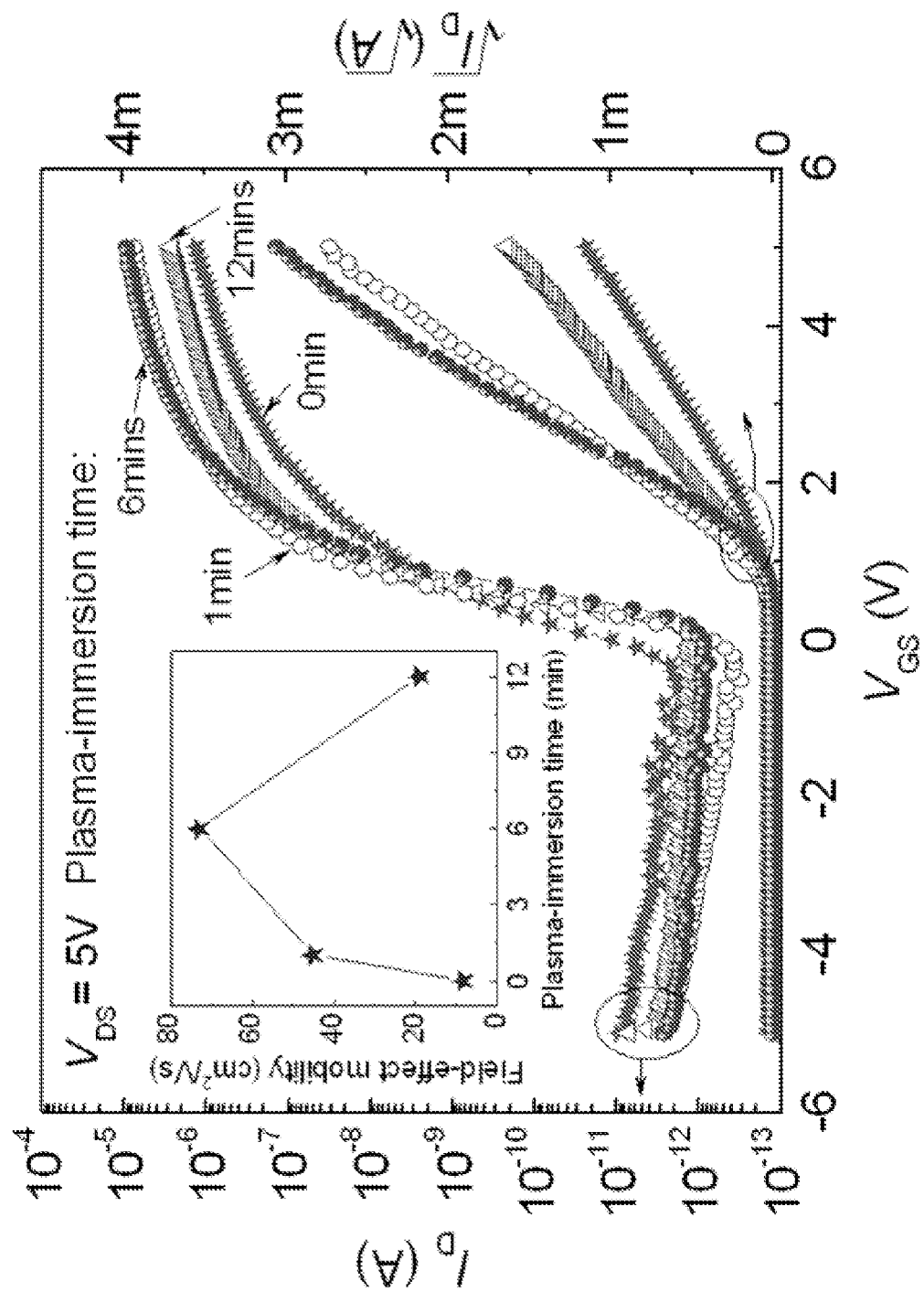
FIG. 5 depicts a graph of $I_D$ as a function of $V_{GS}$ corresponding to various fluorine plasma immersion times.

FIG. 5 depicts a graph of $I_D$ as a function of $V_{GS}$(V) corresponding to various plasma immersion times. Table 2 provides characteristics of ZnO TFTs with the channel subjected to different plasma immersion times.

TABLE 2

Characteristics of ZnO TFTs with the channel subjected to different plasma immersion times.

| | $CF_4$ plasma immersion time (minute) | | | |
|---|---|---|---|---|
| | 0 | 1 | 6 | 12 |
| Corresponding dose ($/cm^2$) | N/A | $2 \times 10^{14}$ | $4 \times 10^{14}$ | $7 \times 10^{15}$ |
| $\mu_{FE}$ ($cm^2/Vs$) | 8.3 | 45.0 | 73.0 | 19.0 |
| $V_{th}$ (V) | 1.2 | 0.9 | 1.2 | 0.8 |
| SS (V/decade) | 0.34 | 0.15 | 0.18 | 0.18 |
| $I_{on}/I_{off}$ | $10^6$ | $10^8$ | $7 \times 10^7$ | $10^7$ |
| $I_{off}$ (pA) | 2.0 | 0.4 | 0.8 | 1.2 |

Figure 6A:
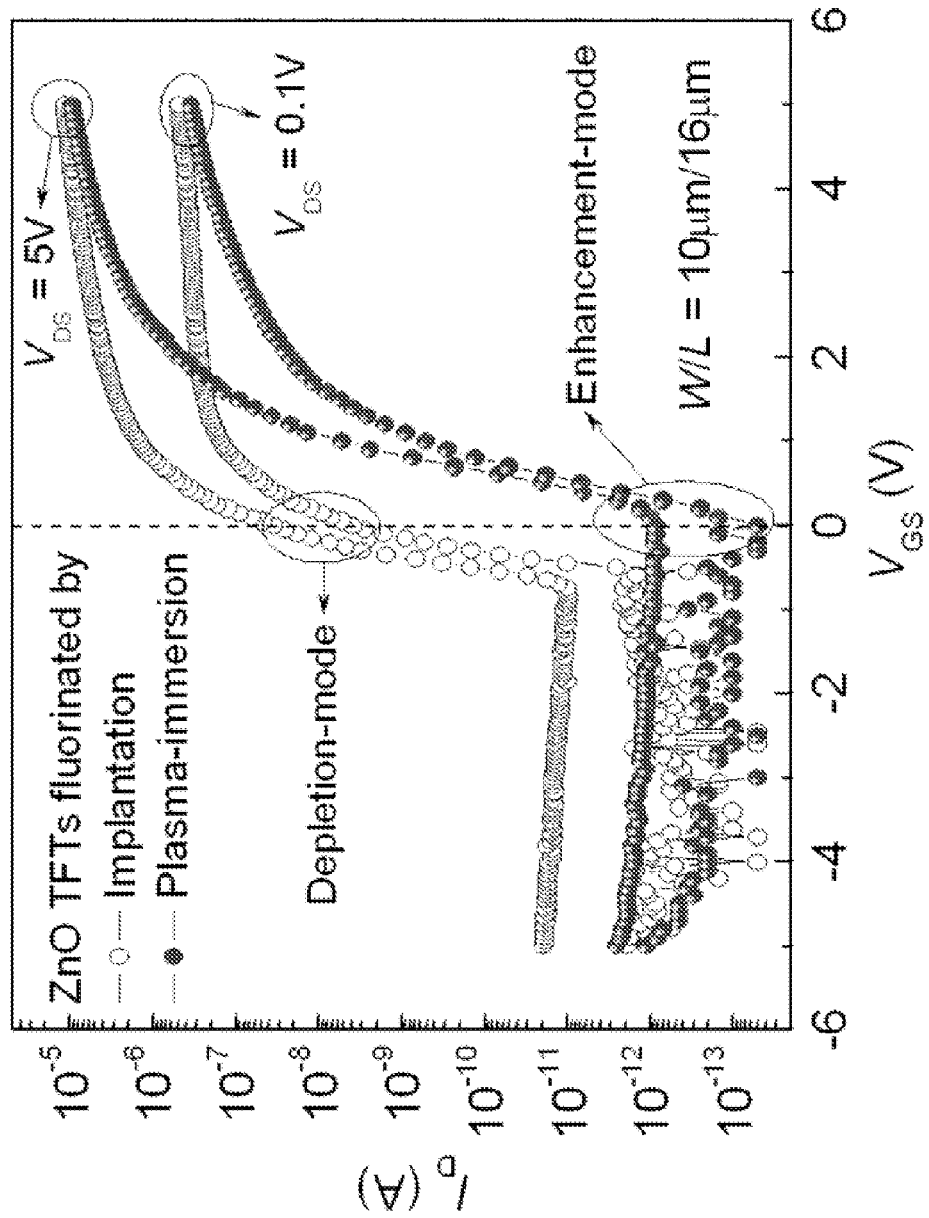
FIG. 6A depicts a graph of $I_D$ vs. $V_{GS}$ comparing the performance of ZnO TFTs fluorinated by implantation to those fluorinated by plasma immersion at $V_{DS}=5V$ and $V_{DS}=0.1V$.
Figure 6B:
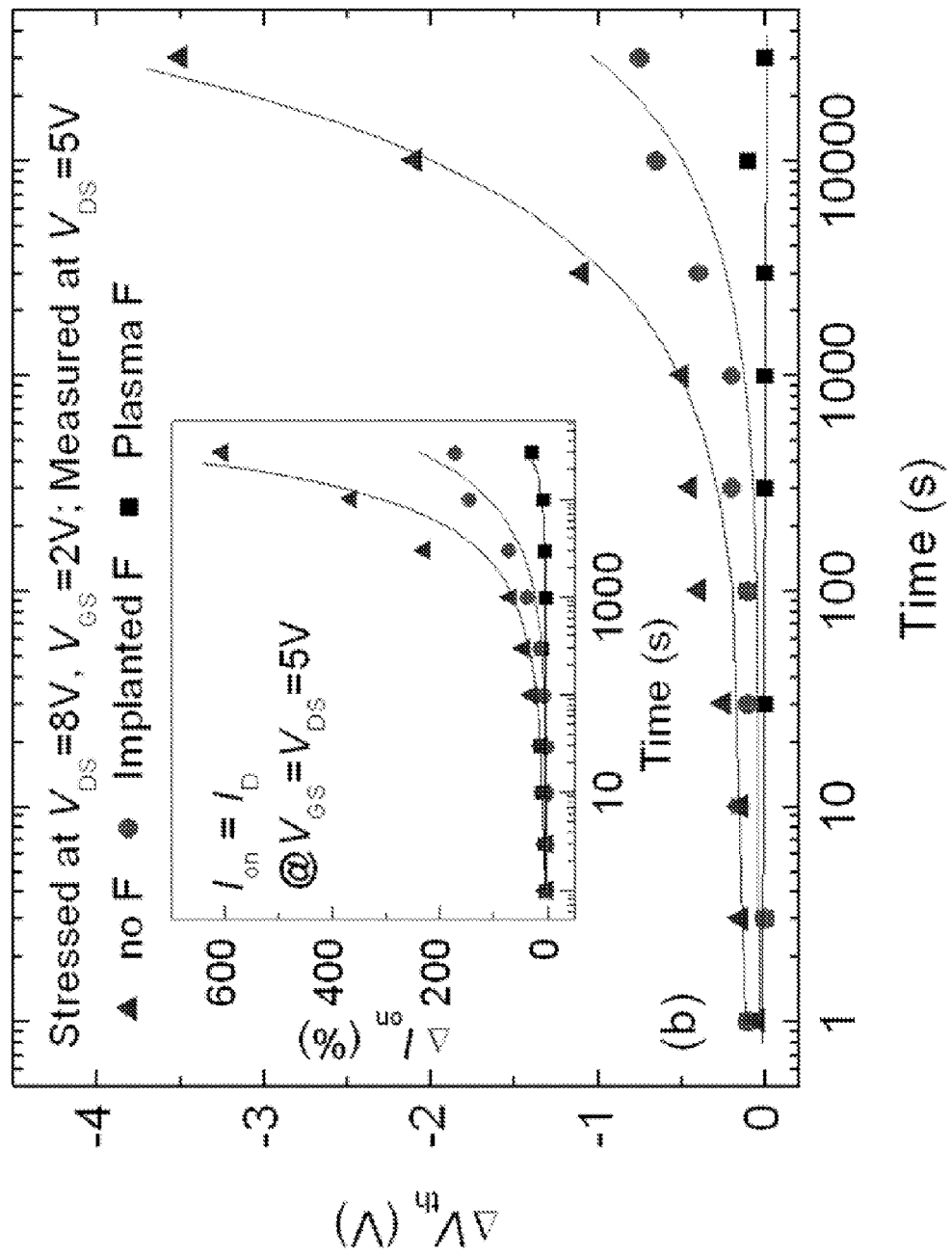
FIG. 6B depicts a graph of $\Delta V_{th}$ (threshold voltage) vs. stress time and $\Delta I_{on}$ (%) vs. stress time comparing the performance of ZnO TFTs fluorinated by implantation, plasma immersion, and without fluorine.

FIG. 6A depicts a graph of $I_D$ vs. $V_{GS}$ comparing the performance of ZnO TFTs fluorinated by implantation to those fluorinated by plasma immersion at $V_{DS}$=5V and $V_{DS}$=0.1V. FIG. 6B depicts a graph of $\Delta V_{th}$ vs. time and $\Delta I_{on}$ (%) vs. time comparing the performance of ZnO TFTs fluorinated by implantation, plasma immersion, and without fluorine. Because the average energy of the ions in a plasma can be significantly lower than that of the ions used for implantation, less damage is induced in the channel of a transistor by the bombardment of the ions. As can be seen by FIGS. 6A and 6B, plasma fluorinated ZnO TFTs with a positive $V_{th}$, a low off current and improved reliability are realized. Further details regarding these experimental tests and other industrial data and standard of reliability testing can be found in Z. Ye and M. Wong, "Characteristics of Plasma-Fluorinated Zinc Oxide Thin-Film Transistors," IEEE Electron Device Lett., vol. 33, no. 8, pp. 1147-1149, Aug. 2012. which is incorporated by reference in its entirety.

All references, including publications, patent applications, and patents, cited herein are hereby incorporated by reference to the same extent as if each reference were individually and specifically indicated to be incorporated by reference and were set forth in its entirety herein.

The use of the terms "a" and "an" and "the" and similar referents in the context of describing the invention (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted. Recitation of ranges of values herein are merely intended to serve as a shorthand method of referring individually to each separate value falling within the range, unless otherwise indicated herein, and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate the invention and does not pose a limitation on the scope of the invention unless otherwise claimed. No language in the specification should be construed as indicating any non-claimed element as essential to the practice of the invention.

Preferred embodiments of this invention are described herein, including the best mode known to the inventors for carrying out the invention. Variations of those preferred embodiments may become apparent to those of ordinary skill in the art upon reading the foregoing description. The inventors expect skilled artisans to employ such variations as appropriate, and the inventors intend for the invention to be practiced otherwise than as specifically described herein. Accordingly, this invention includes all modifications and equivalents of the subject matter recited in the claims appended hereto as permitted by applicable law. Moreover, any combination of the above-described elements in all possible variations thereof is encompassed by the invention unless otherwise indicated herein or otherwise clearly contradicted by context.

The invention claimed is:

1. A thin-film transistor, comprising:
   a substrate;
   a metal oxide semiconductor active layer, the semiconductor active layer comprising source and drain regions doped with non-fluorine donor ions and further doped with fluorine, and a fluorine-doped channel region disposed adjacent to the source and drain regions, wherein the fluorine is not a donor to the source, drain and channel regions and is configured to passivate the source, drain and channel regions with respect to defects in the metal oxide semiconductor active layer to increase mobility;
   a gate electrode disposed over the semiconductor active layer, configured to induce a continuous conduction channel in the channel region between the source and drain regions; and
   a gate dielectric material separating the gate electrode and the channel region;
   wherein the volume concentration of fluorine in the channel region of the semiconductor active layer is between approximately $10^{19}$ and $4\times10^{20}/cm^3$; and
   wherein the volume concentration of fluorine in the source and drain regions is greater than or equal to approximately $5\times10^{20}/cm^3$.

2. The thin-film transistor of claim 1, wherein the material of the source and drain regions is the same metal-oxide semiconductor as the channel region.

3. The thin-film transistor of claim 1, wherein the material of the source and drain regions is a metal-oxide semiconductor different from the metal-oxide semiconductor of the channel region.

4. The thin-film transistor of claim 1, wherein the thin-film transistor has at least one of the following configurations: horizontal electrodes, vertical electrodes, coplanar electrodes, staggered electrodes, top-gated, bottom-gated, or double-gated.

5. The thin-film transistor of claim 1, wherein the semiconductor active layer is at least one of an oxide of zinc, an oxide of tin, an oxide of copper, an oxide of indium, or an oxide of an alloy comprising at least two or more elements from the group consisting of: zinc, tin, indium, gallium, aluminum, titanium, silver, and copper.

6. The thin-film transistor of claim 1, wherein the semiconductor active layer is in an amorphous, polycrystalline, or single-crystalline state.

7. The thin-film transistor of claim 1, wherein the thickness of the semiconductor active layer is between approximately 20 nm and 2000 nm.

8. The thin-film transistor of claim 1, wherein the substrate comprises glass, polymer, insulated stainless steel, amorphous silicon, polycrystalline silicon, or single-crystalline silicon containing pre-fabricated conventional integrated circuits.

9. The thin-film transistor of claim 1, wherein the substrate is covered with an electrically insulating layer.

10. The thin-film transistor of claim 1, wherein the gate electrode is made of metal, transparent-conducting oxide, or layer combinations thereof.

* * * * *